United States Patent [19]
Lee

[11] Patent Number: 4,633,282
[45] Date of Patent: Dec. 30, 1986

[54] METAL-SEMICONDUCTOR FIELD-EFFECT TRANSISTOR WITH A PARTIAL P-TYPE DRAIN

[75] Inventor: Chien-Ping Lee, Pasadena, Calif.

[73] Assignee: Rockwell International Corporation, El Segundo, Calif.

[21] Appl. No.: 432,463

[22] Filed: Oct. 4, 1982

[51] Int. Cl.[4] .............. H01L 29/48; H01L 29/06; H01L 29/80; H01L 29/12

[52] U.S. Cl. ......................... 357/22; 357/15; 357/20; 357/41; 357/58; 357/86

[58] Field of Search ............. 357/22 G, 22 P, 22 S, 357/22 E, 22 R, 23 TF, 58, 80, 86, 88, 91, 20, 41, 15, 92

[56] References Cited

U.S. PATENT DOCUMENTS

| | | | |
|---|---|---|---|
| 3,404,450 | 10/1968 | Karcher | 357/22 |
| 3,602,781 | 8/1971 | Hart | 357/15 |
| 3,896,476 | 7/1975 | Kawakami . | |
| 3,967,305 | 1/1976 | Zuleeg | 357/15 |
| 4,012,761 | 3/1977 | Ferro et al. . | |
| 4,060,825 | 11/1977 | Schlegel . | |
| 4,163,237 | 7/1979 | Dingle et al. | 357/22 |
| 4,183,033 | 1/1982 | Rees | 357/23 TF |
| 4,240,091 | 12/1980 | Yatsuo et al. . | |
| 4,261,001 | 4/1981 | Temple . | |
| 4,346,394 | 8/1982 | Figueroa et al. | 357/22 |
| 4,377,030 | 3/1983 | Pettenpaid et al. | 357/22 |
| 4,471,369 | 9/1984 | Anthony et al. | 357/55 |

FOREIGN PATENT DOCUMENTS

| | | | |
|---|---|---|---|
| 0051271 | 5/1982 | European Pat. Off. | 357/22 S |
| 2458401 | 6/1976 | Fed. Rep. of Germany . | |
| 2739187 | 3/1979 | Fed. Rep. of Germany . | |
| 53-122386 | 10/1978 | Japan | 357/15 |
| 54-35684 | 3/1979 | Japan | 357/22 |
| 55-18052 | 5/1980 | Japan | 357/23 TF |
| 57-27069 | 2/1982 | Japan | 357/23 TF |

Primary Examiner—J. Carroll
Attorney, Agent, or Firm—H. F. Hamann; C. O. Malin

[57] ABSTRACT

A metal-semiconductor field-effect transistor (MESFET) is provided with a p-type region adjacent the n-type region under the drain contact. Holes injected from this p-type region compensate the negative space charge region at the channel to substrate interface, thus minimizing considerable substrate effects.

6 Claims, 10 Drawing Figures

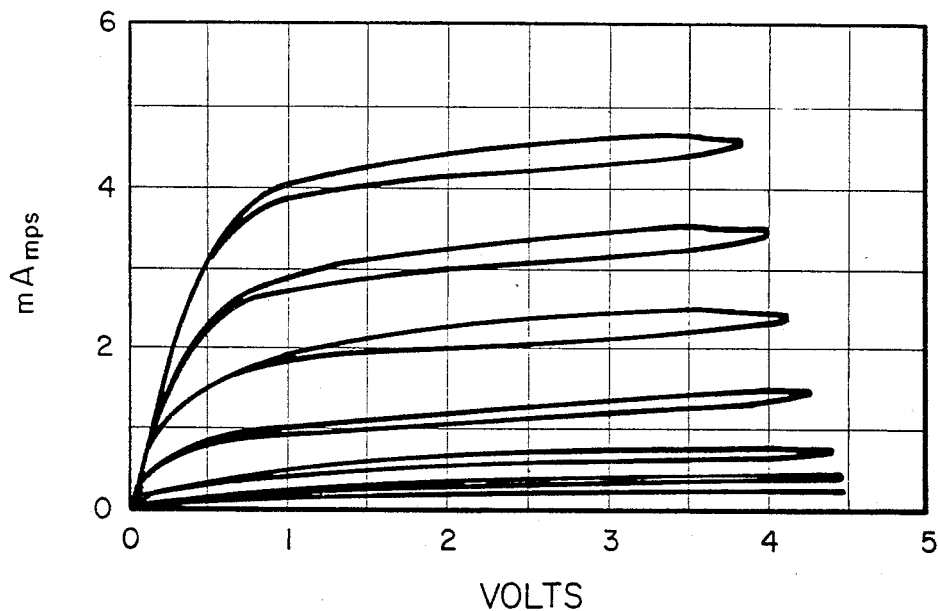
Fig. 3. a., (PRIOR ART)
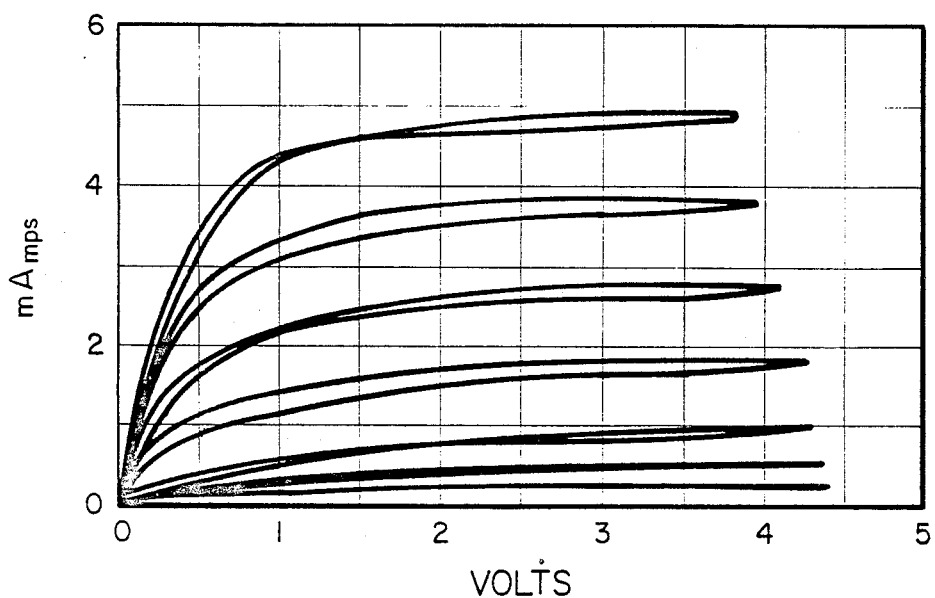
Fig. 3. b., (PRIOR ART)

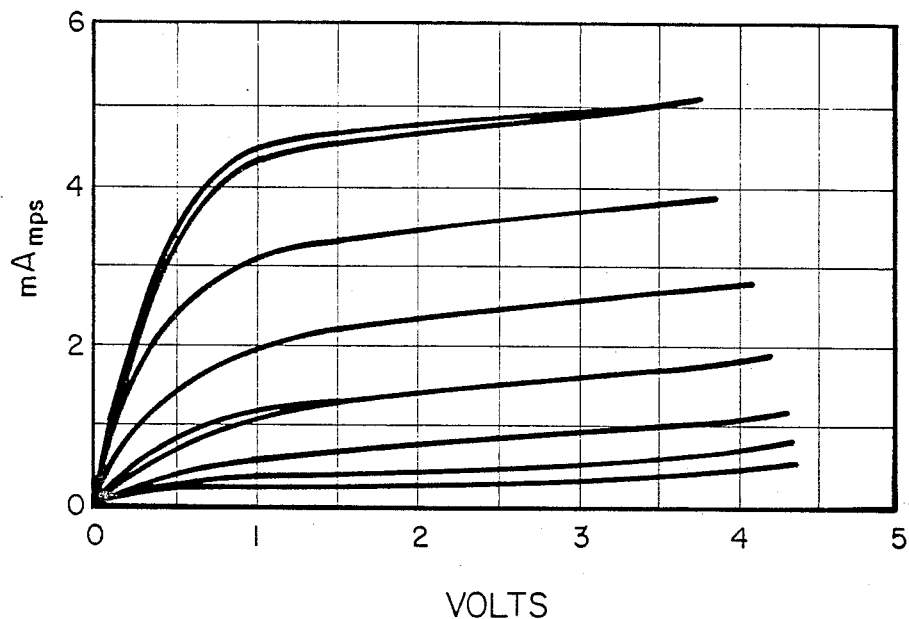
Fig.4.a.,
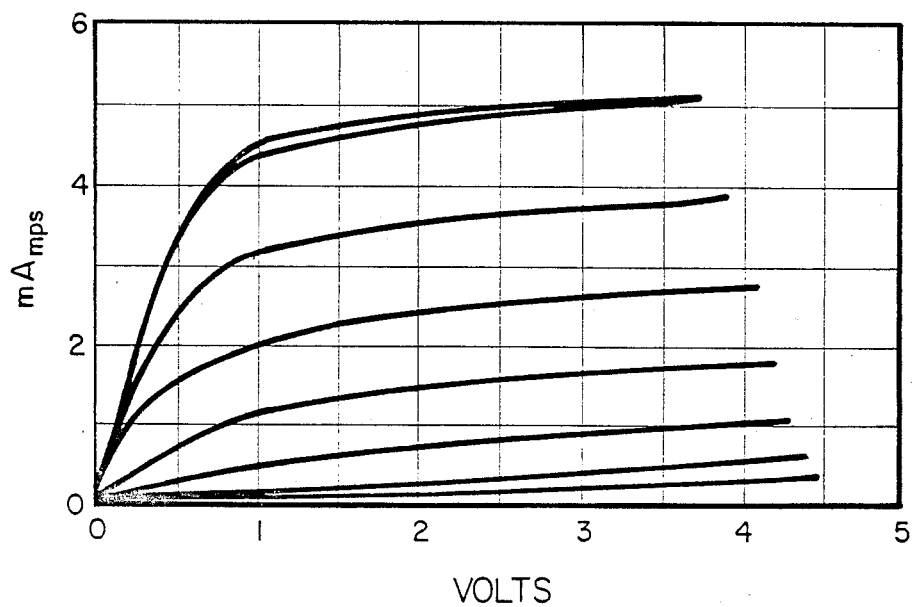
Fig.4.b.,

METAL-SEMICONDUCTOR FIELD-EFFECT TRANSISTOR WITH A PARTIAL P-TYPE DRAIN

BACKGROUND OF THE INVENTION

This invention relates to the field of solid state electronics and particularly to field-effect transistors (FETs).

Metal-semiconductor field-effect transistors (MESFETs) fabricated on semi-insulating substrates such as GaAs usually suffer from the so-called "substrate effect", normally considered responsible for undesirable device behavior such as looping in the drain current-voltage characteristics and sensitivity to light. The origin of this effect is the existence of a space-charge region, caused by deep-level impurity traps in the substrate, at the interface between the n-type channel (or active) layer and the substrate. This effect is usually reduced if an additional GaAs buffer layer is grown between the substrate and the channel layer so that the traps in the substrate are not "seen" by the channel layer. This method, however, requires an extra epitaxial growth procedure and is not compatible with the all-implantation fabrication approach.

SUMMARY OF THE INVENTION

It is an object of the invention to provide an improved MESFET.

It is an object of the invention to provide a MESFET which does not exhibit the "substrate effect".

It is an object of the invention to provide a MESFET which is free of hysteresis (looping) in its drain current-voltage characteristics.

It is an object of the invention to provide a MESFET which is not light sensitive.

According to the invention, a p-type region is implanted next to the n+-type region under the drain contact of an otherwise standard MESFET. Thus, the drain consists of two parts, an n-type part which serves as a standard drain for electron collection and a p-type part which serves as a hole injecting source. In operation, holes injected from the drain fill the hole traps at the channel-substrate interface and compensate the negative space-charge region. The depletion region extending into the channel layer is therefore reduced, and the usual substrate effects resulting from this depletion region are minimized. These and other objects and features of the invention will be apparent from the following detailed description taken with reference to the accompanying drawings.

BRIEF DESCRIPTION OF THE DRAWINGS

FIGS. 3(a) and 3(b) are current-voltage characteristics of a prior art MESFET under dark and light illumination, respectively, FIGS. 4(a) and 4(b) are current-voltage characteristics of a P-FET in dark and light environments, respectively.

DESCRIPTION OF THE PREFERRED EMBODIMENT

Figure 1:
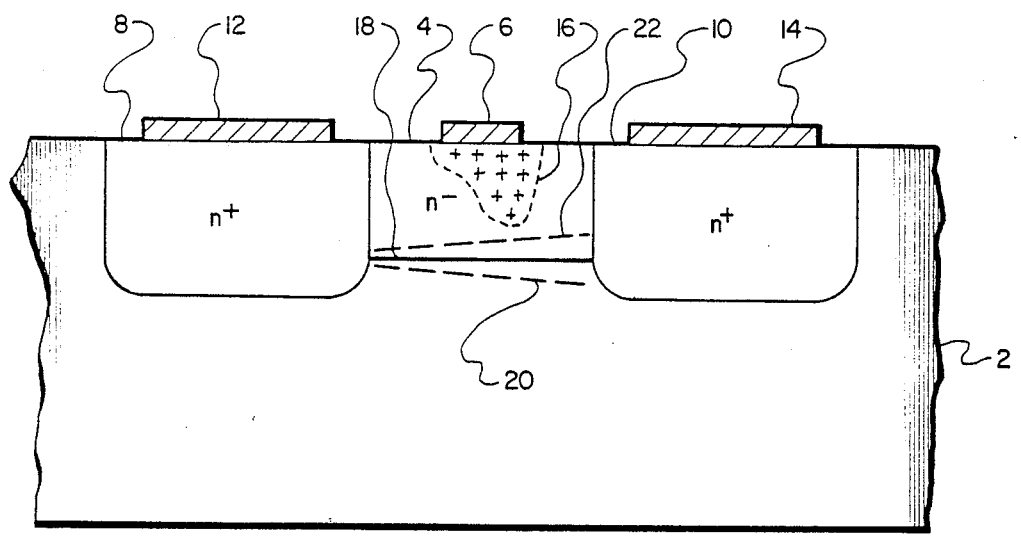
FIG. 1 is an illustration of a prior art MESFET.

FIG. 1 shows a prior art, planar, ion-implanted MESFET fabricated on a semi-insulating GaAs substrate 2. The MESFET has an $n^-$-type channel 4 under gate 6 and two spaced apart $n^+$-type regions 8, 10 under the source 12 and drain 14. Gate 6 is reverse-biased with respect to channel 4 creating depletion region 16 under gate 6.

In the standard structure, a space-charge region exists at the channel-substrate interface 18 with the negative space-charge region 20 extending into substrate 2 and the positive space-charge region 22 extending into n-type channel 4, thus causing the substrate effect. According to several studies, for devices fabricated on Cr-doped semi-insulating GaAs, the traps which are responsible for this substrate effect are Cr related hole traps.

Figure 2:
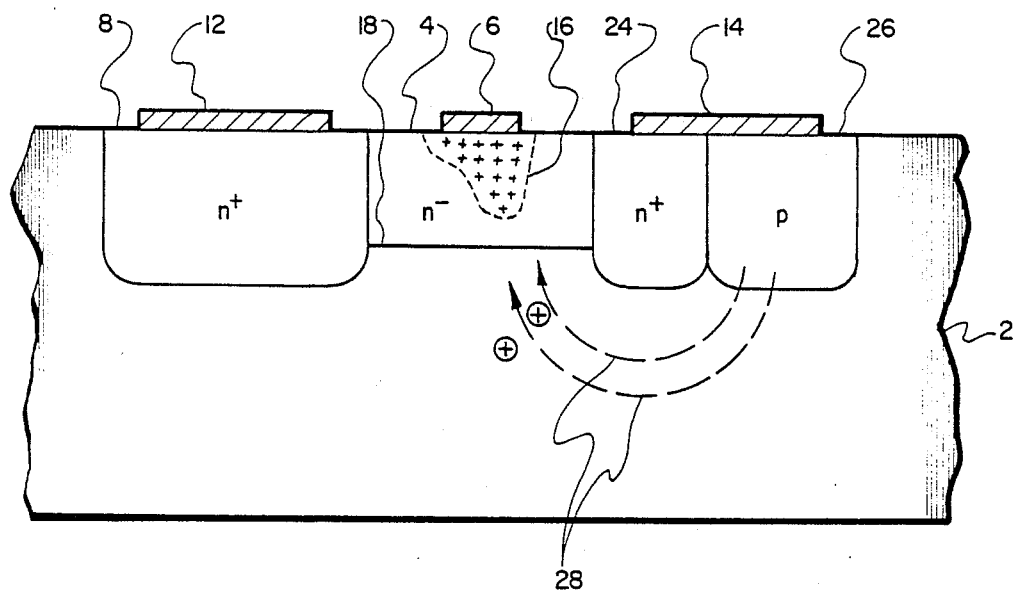
FIG. 2 is an illustration of a selective ion-implanted p-FET according to the present invention.

FIG. 2 illustrates a preferred embodiment of the invention which minimizes the substrate effect. For comparison, general features of the FETS in FIG. 1 and 2 are similar and the same reference numbers are used to identify similar features. The major difference in the new structure is in the doped region under drain contact 14 which consists of a regular $n^+$-type region 24 and a p-type region 26. For this reason, the invention is called a p-FET.

The n-type region 24 of the drain serves as a standard drain for electron collection, while the p-type region 26 serves as a hole injecting source. In operation, holes injected from the drain fill the hole traps at channel-substrate interface 18 and compensate the negative space-charge region as shown by arrows 28.

Devices according to the invention have been fabricated by using selective ion-implantation directly into semi-insulating GaAs substrates. The n-type channel 4 and the $n^+$ regions 8, 24 under source 12 and drain 14 were implanted by Se and Si respectively. The p-type region 26, which is 1.5 μm away from the edge of $n^+$ drain 24, was implanted with 100 keV Be to a dose of $2.3 \times 10^{13}$ cm$^{-2}$. The ohmic contacts to source 12 and drain 14 were alloyed AuGe/Ni; Schottky metal gate 6 (1 μm long) was Ti/Pt/Au. The spacing between implanted source 8 and drain 24 was 3 μm.

For a valid comparison, standard FETs were fabricated along with the p-FETS side by side on the same wafer. The FETS used in this experiment were 50 μm wide and had threshold voltages in the 1.2 V range. Measurements of the device characteristics were carried out in both dark and light (microscope illumination) environments. The results of measurements made in a dark environment at several gate voltages (0.2 V per step) are shown in FIG. 3 and 4. FIGS. 3(a) and 3(b) show the current-voltage characteristics of a prior art FET in dark and light environments, respectively. The characteristics were light sensitive and exhibited hysteresis (looping) behavior indicating the presence of substrate effects from the deep level traps at channel-substrate interface. On the other hand, the characteristics of the p-FET were not light sensitive and were free of hysteresis as shown in FIGS. 4(a) and 4(b) for dark and light environments, respectively. The threshold voltage of the p-FET is slightly higher than that of the comparable prior art FET. This is because the actual width of the space charge region at channel-substrate interface 18 is reduced as a result of holes being injected from p-drain region 26 compensating the negative space charge region 20 present at the interface.

Figure 5:
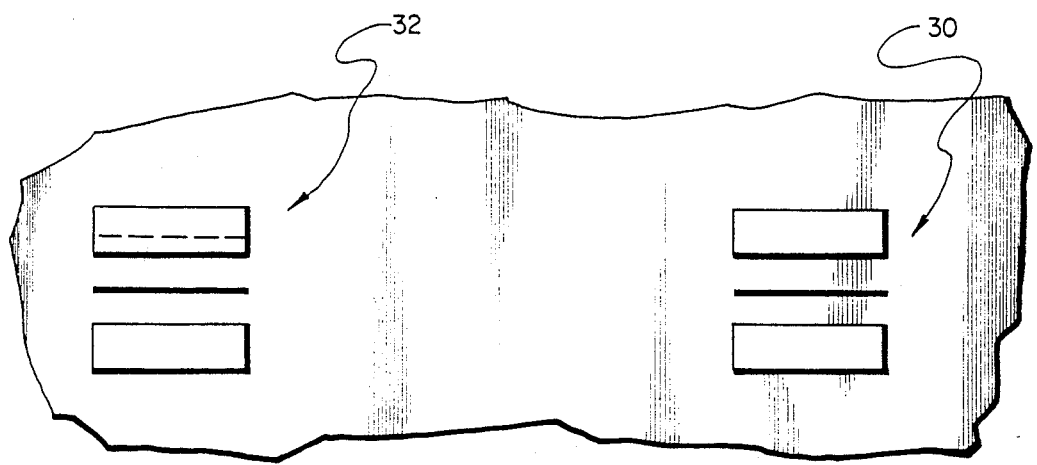
FIG. 5 is a schematic of the test structure used to compare the backgating characteristics of a p-FET with these of a prior art MESFET.

The space charge region at the channel-substrate interface of a MESFET is also the cause of the so-called "backgating effect". Through the modulation of this interface junction or the backgate, the device characteristics can be influenced by the negative voltage applied to adjacent devices. This effect can degrade device performance and prevent optimal circuit operation. The backgating on p-FETs has been studied and compared with those on prior art FETs. The test structure used for this experiment is shown in FIG. 5. A 10 μm wide FET 30 and a 10 μm wide p-FET 32 prepared by selective ion implantation were placed 34 μm away from each other on a semi-insulating substrate. The saturation current, $I_{DSS}$, of each FET (measured at $V_{DS}=2.5$ V and $V_{GS}=0$ v) was measured as a function of the negative backgating voltage, $V_{BG}$, applied to the other FET. The measurements were carried out in both dark and light (microscope illumination) conditions; a sawtooth function generated with a frequency of 0.02 Hz was used as the backgating voltage source.

Figure 6:
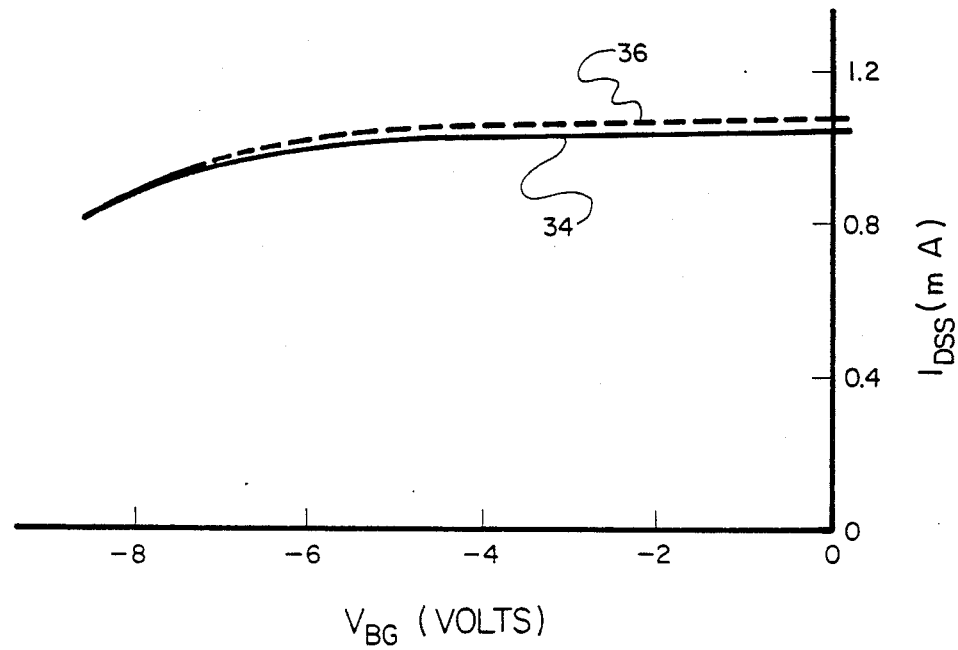
FIG. 6 is the backgating characteristics of a p-FET.
Figure 7:
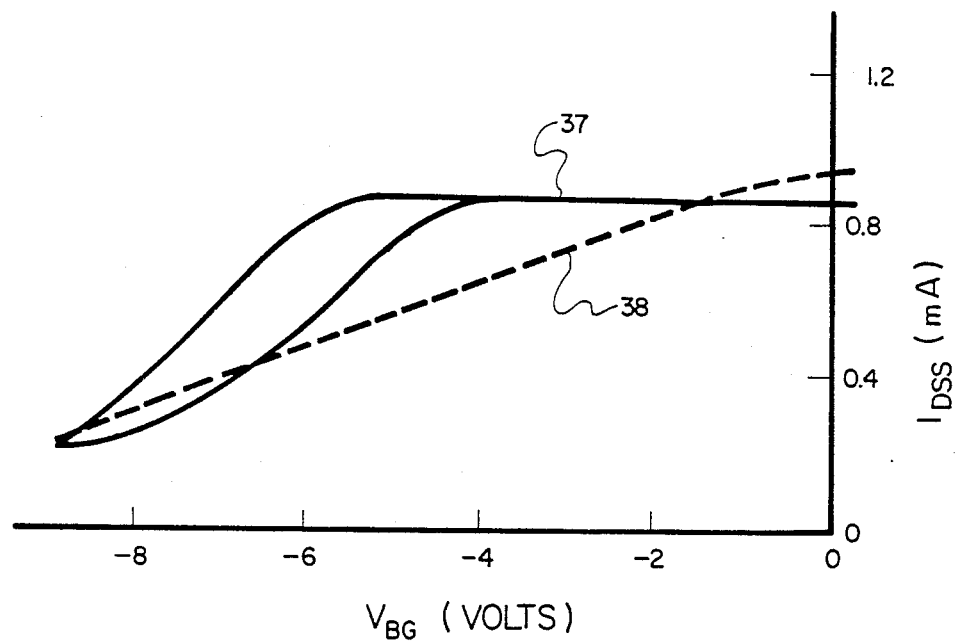
FIG. 7 is the backgating characteristics of a prior art MESFET.

For p-FET 32, backgating did not occur until $V_{BG}$ reached −6 V as shown in FIG. 6. Above this threshold $I_{DSS}$ decreased gradually, and at $V_{BG}=-8$ V less than 15% change in $I_{DSS}$ was observed. This characteristic was not light sensitive; nearly identical traces were obtained for both dark conditions 34 and light conditions 36. In contrast, the prior art FET showed much stronger backgating effect (see FIG. 7), and the effect was light sensitive. Under dark conditions 37, a threshold for backgating was also observed at $V_{BG}=-6$ V. But after the threshold was reached, $I_{DSS}$ decreased at a much higher rate with $V_{BG}$ and a large hysteresis was observed. Under light illumination 38, the backgating was stronger and existed at even lower backgating voltages. The difference in backgating effect between a p-FET and a comparable prior art FET again demonstrates that hole injection from the p-type regions of p-FETs can minimize substrate effects by compensating the negative space charge region at the channel-substrate interface.

Although p-FETs possess many advantages over conventional GaAs FETs, care still has to be taken in actual fabrication of these devices. Because of the p-type region, the drain-substrate-source in a p-FET is a p-i-n structure. If there is a substantial leakage of hole current from the drain to the source, device characteristics can be degraded. This can happen in cases when the substrate is slightly p-type or when the p-type region is too close to the source. Therefore, it is important to use qualified high resistive semi-insulating substrates for this application and to keep the distance between the p-type region and the n+ source long enough so that the field between them is not too high to cause any leakage problem.

Since the depletion region at the channel-substrate-interface of a p-FET is greatly reduced, many material factors which may normally affect the interface depletion region in a regular FET do not play a role in p-FETs. The device uniformity and reproducibility, which are normally influenced by the material properties such as the types of impurities and the concentration and distribution of impurities in the substrate, should also improve when p-FETs are used.

Figure 8:
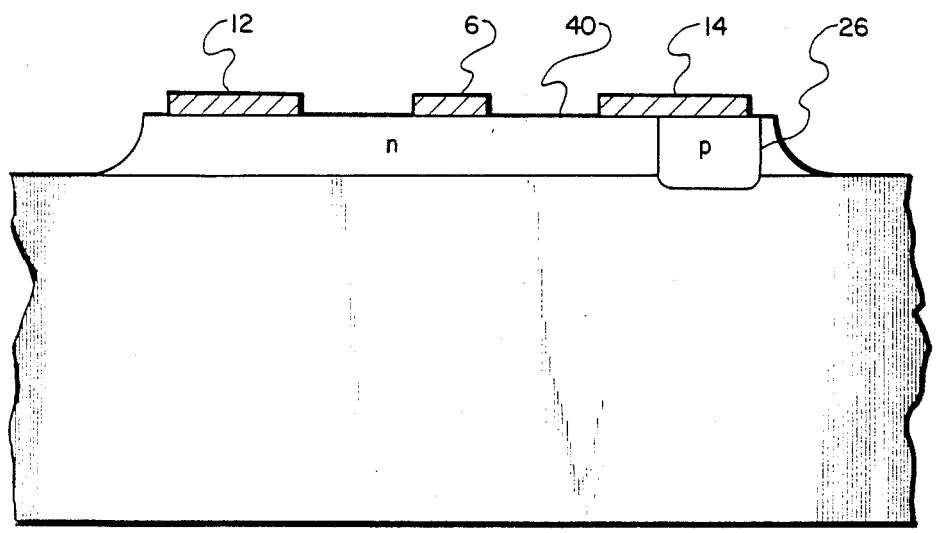
FIG. 8 is an illustration of a mesa isolated P-FET fabricated on an epitaxially grown active layer according to the present invention.

Numerous variations and modifications can be made without departing from the invention. For example, the p-type region can be spaced a short distance from the n-type drain, rather than being in direct contact with it. In such construction, a separate contact can be used to provide the p-type region with a positive bias. Or, rather than by selective implantation, a p-FET can be also fabricated on an epitaxially grown active layer 40, as shown in FIG. 8. In such construction, the p-type region 26 can be implanted after the epitaxial-growth, and the device can be isolated by mesa etching as shown in FIG. 8, or by proton bombardment as known in the art. Accordingly, it should be understood that the form of the invention described above is illustrative only and is not intended to limit the scope of the invention.

What is claimed is:

1. An improvement in a metal-semiconductor field-effect transistor (MESFET) having:
   a pair of spaced apart n+-type regions on a semi-insulating GaAs substrate, a source contact on one of said n+-type regions and a drain contact on the other of said n+-type regions, an n−-type channel between said pair of spaced apart n+-type regions, and a Schottky-metal gate contact on said channel;
   said improvement comprising a p-type region adjacent said other n+-type region, said p-type region not extending under either said source or said gate contacts, and
   an ohmic contact on said p-type region for applying a positive bias to said p-type region which is at least equal to the positive bias applied to said drain contact.

2. The improvement as claimed in claim 1, wherein said p-type region abuts said other n+-type region and said ohmic contact comprises a portion of said drain contact which extends over said p-type region.

3. An improvement in a metal-semiconductor field-effect transistor (MESFET) having:
   a pair of spaced apart n+-type regions on a semi-insulating GaAs substrate, a source contact on one of said n+-type regions, and a drain contact on the other of said n+-type regions, an n−-type channel between said pair of spaced apart n+-type regions and a Schottky-metal gate on said channel;
   said improvement comprising a p-type region under a portion of said drain contact and contacting said drain contact but not extending under either said source or said gate contacts.

4. An improvement in a metal-semiconductor field-effect transistor (MESFET) having:
   an n-type active layer on semi-insulating GaAs substrate, source and drain contacts on said active layer, and Schottky-metal gate contact on said active layer between said source and drain contacts;
   said improvement comprising a p-type region in said active layer adjacent said drain contact but not extending under either said source or said gate contacts, and
   an ohmic contact on said p-type region for applying a positive bias to said p-type region which is at least equal to the positive bias applied to said drain contact.

5. The improvement as claim in claim 4, wherein said ohmic contact comprises a portion of said drain contact which extends over said p-type region.

6. An improvement in a metal-semiconductor field-effect transistor (MESFET) having:

an n-type active layer on a semi-insulating GaAs substrate, source and drain contacts on said active layer, and a Schottky-metal gate contact on said active layer between said source and drain contacts;

said improvement comprising a p-type region in said active layer under a portion of said drain contact, said p-type region not extending under either said source or said gate contacts.

* * * * *